United States Patent [19]

Kakihana

[11] Patent Number: 5,034,347
[45] Date of Patent: Jul. 23, 1991

[54] PROCESS FOR PRODUCING AN INTEGRATED CIRCUIT DEVICE WITH SUBSTRATE VIA HOLE AND METALLIZED BACKPLANE

[75] Inventor: Sanehiko Kakihana, San Francisco, Calif.

[73] Assignee: Menlo Industries, Fremont, Calif.

[21] Appl. No.: 575,242

[22] Filed: Aug. 30, 1990

Related U.S. Application Data

[60] Division of Ser. No. 449,222, Dec. 5, 1989, abandoned, which is a continuation of Ser. No. 105,649, Oct. 5, 1987, abandoned.

[51] Int. Cl.$^5$ .......................................... H01L 21/44
[52] U.S. Cl. ............................ 437/187; 437/209; 437/245; 437/927; 437/203; 437/902
[58] Field of Search ............... 437/187, 203, 228, 90, 437/184, 185, 902, 38; 357/81; 156/653; 148/DIG. 51, DIG. 106

[56] References Cited

U.S. PATENT DOCUMENTS 3,844,858 10/1974 Bean ........................... 148/DIG. 51
4,346,513 8/1982 Nishizawa et al. .................. 437/90
4,508,815 4/1985 Ackmann et al. .................. 437/187
4,794,093 12/1988 Tong et al. .......................... 437/203
4,807,022 2/1989 Kazior et al. ....................... 437/902

OTHER PUBLICATIONS

Y. Hirachi et al., "A Packaged 20-GHz 1-W GaAs MESFET with a Novel Via-Hole Plated Heat Sink Structure", *IEEE Transactions on Microwave Theory and Techniques*, vol. MTT-32, No. 3, pp. 309-316, Mar., 1984.
M. Kobiki et al., "A Ka-Band GaAs Power MMIC", *IEEE Internat'l Microwave Symposium* Digest, MTT-S 1985, pp. 31-34.
K. C. Gupta et al., *Microstrip Lines and Slotlines*, Artech House, Inc., 1979, Chapter 1.

*Primary Examiner*—Brian E. Hearn
*Assistant Examiner*—Michael Trinh
*Attorney, Agent, or Firm*—Skjerven, Morrill, MacPherson, Franklin & Friel

[57] ABSTRACT

Disclosed is a process for producing a monolithic microwave integrated circuit device utilizing a body having a first thickness in the heat producing region and a second thickness in the region adjacent to the microstrip transmission lines.

6 Claims, 2 Drawing Sheets

PROCESS FOR PRODUCING AN INTEGRATED CIRCUIT DEVICE WITH SUBSTRATE VIA HOLE AND METALLIZED BACKPLANE

This application is a division of application Ser. No. 07/449,222, filed Dec. 5, 1989, which was a continuation of Ser. No. 07/105,649, filed Oct. 5, 1987, both abandoned.

BACKGROUND OF THE INVENTION

1. Field of the Invention

This invention relates to monolithic integrated circuit devices and more particularly to microwave monolithic integrated circuit devices.

In the field of monolithic microwave integrated circuit devices of the high power type which are used in microwave systems, such devices are typically implemented using a metallized backside on a GaAs substrate, with the metallized backside being utilized as the ground. Via holes are opened from the backside through the substrate to provide a low inductance connection from the sources of the active devices (FET's) on the front side of the wafer to the metallized backside. In addition, the metallized backside also forms the contact plane to the heat sink in the final assembled package. In addition to the active devices on the front side of the wafer, microwave transmission lines are also included thereon, which are implemented in microstrips, using the metallized backside as the ground plane. Accordingly, there are two areas of such a device which are critical and have different required characteristics. First, it is desirable to have a thin substrate in the area of the active devices to permit good heat transmission to the metallized backplane so that the heat from the active devices will be transmitted to the heat sink in the assembled package. On the other hand, utilizing a thin substrate, or body, in the region above the transmission lines brings certain difficulties which will be described more fully hereinafter in the description of the prior art.

2. Description of the Prior Art

In the prior art, one of the attempted solutions to the heat flow and heat dissipation problem with GaAs devices has been to provide a layout in the active device area which provides for spacing out the individual gate fingers in an interdigitated FET layout. In so doing, the sources of heat are spread over the surface of the substrate which decreases the thermal resistance between the fingers and the backplane, however the thermal resistance does not decrease linearly with increasing gate finger spacing due to the two-dimensional nature of heat flow. More particularly, thermal resistance is inversely proportional to the cross-sectional area of the heat source and is proportional to the distance between the heat source and the heat sink. With this solution, although the thickness of the body may be maintained such that the microwave transmission line characteristics are maintained to avoid microstrip problems, the spacing of the gate fingers brings with it a problem that at high frequencies, the amount of acceptable phase variation on the gate feed and the required output level dictate that the gate finger spacing be as small as permitted by processing considerations. The gate finger spacing solution is more fully described in an article entitled "A Packaged 20-GHz 1-W GaAs MESFET With A Novel Via-Hole Plated Heat Sink Structure" by Y. Hirachi, Y. Takeuchi, M. Igarashi, K. Kosemura and S. Yamamoto, appearing in IEEE Transactions on Microwave Theory and Techniques, Vol. MTT-32, No. 3, pages 309-316, March, 1984. FIG. 1 in this article is particularly relevant to the gate finger spacing consideration. The attempted solution of spacing the gate fingers to provide adequate heat conduction through a substrate adequately thick to avoid transmission line problems is impractical and is not effective because of the phase variation on the gate feed.

A second attempted solution is to provide a thinner GaAs substrate, to accomplish the reduction of the heat transfer resistance. Substrate thicknesses as small as 30 microns have been used for discrete power FETs, this approach having been described in a paper entitled "A Ka-Band GaAs Power MMIC" in the IEEE International Microwave Symposium Digest, MTT-S 1985, pages 31-34. This approach is not suitable for monolithic microwave integrated circuit devices because of two serious disadvantages, the first of which is that the yield is low due to the increased probability of breakage during die separation and die attachment. Since the number of dies per wafer in the monolithic microwave integrated circuit devices is at least fewer by a factor of four, the yield issue is much more important for these devices than it is for discrete FETs. Secondly, when a thin substrate is utilized in the microwave frequency, this requires a very narrow microstrip, which appears on the front side of the device, must be used for a high impedance microstrip line. As mentioned earlier, in the transmission line area the metallized backside functions as the ground plane and the distance between the microstrip transmission lines on the front side of the device and the metallized backplane on the back side of the device are critical in determining the impedance of the microstrip transmission line. The impedance of a microstrip is uniquely determined by the ratio of the microstrip width to the substrate thickness for a given substrate material. This is more fully described in Chapter 1 of the book entitled *Microstrip Lines and Slotlines*, by K. C. Gupta, Ramesh Garg and L. J. Bahl, published by Artech House, Inc., 1979. The closer the microstrip is to the backplane, i.e. a thinner substrate between them, the narrower the microstrip width must be for implementing a given impedance. For example, a 150 ohm line, which is a common value for matching stubs utilizing a 30 micro thick GaAs substrate requires that the width of the microstrip must be 0.8 microns. Such a narrow width is not only difficult to implement, but is very lossy at high frequencies.

Thus it can be seen from the foregoing that the prior art has not provided a high frequency device which has the advantages of good heat conduction, which for a high power and high frequency device requires a relatively thin substrate, and a sufficiently thick substrate to provide achievable microstrip widths to avoid the problems mentioned above.

SUMMARY OF THE INVENTION

It is an object of the invention to provide a monolithic integrated circuit device which overcomes the disadvantages of the prior art and provides a microwave integrated circuit having good heat conduction in the active device area and a body thickness in the area of the transmission line portions of the device which permits the fabrication of microstrip lines with reasonable size and low microwave loss.

Another object of the invention is to provide processes for producing a device having the aforementioned characteristics.

In accordance with the invention, a process is provided for producing a metallic backplane on a body of semiconductor material having a first side which includes integrated circuit devices and a second side, wherein said backplane provides electrical connection to a contact pad on said first side and provides heat conduction from a region on said first side, which process comprises the steps of: depositing a first mask material on said second side of said body opposite to said contact pad and said region; depositing a second mask material on said first mask material; removing said first and second mask materials in an area opposite said contact pad; etching said second body side to remove a portion of said body below the unprotected area; removing said first and second mask materials in an area opposite said region; etching said second body side for a time sufficient to remove substantially all of the body material to said contact pad but for a time less than that which removes the body material to said region; removing said first and second mask materials; and depositing a metal on said second side of said body.

In accordance with another feature of the invention, in practicing the above-mentioned process a first mask comprised of calcium fluoride is utilized.

In accordance with another feature of the invention, the process is practiced through the utilization of the photoresist as the second mask material.

In accordance with yet another feature of the invention, the step of etching the body is performed by a reactive ion etching process.

In accordance with a further feature of our invention, the above-mentioned reactive ion etching process utilizes $SiCl_4/Cl_2$ as the etchant.

In accordance with another feature of our invention, the step of depositing metal on the second side of said body is performed by plating.

As a further feature of our invention, provided is a monolithic integrated circuit device comprising: a body with first and second sides, said first side including at least one active device region and at least one signal transmission region, said second side having a metallic material applied thereto and extending above said at least one active device region and said at least one signal transmission region, wherein said second side is contoured such that said body has a first thickness above said active device region and a second thickness above said signal transmission region.

In accordance with another feature of the invention, the second body thickness of the aforementioned device is greater than the first body thickness.

As yet another feature of our invention, the foregoing devices are produced utilizing GaAs for the semiconductor body.

As yet another feature of our invention, the above-mentioned integrated circuit device utilizes gold as the metallic material on the second side of the integrated circuit device.

BRIEF DESCRIPTION OF THE DRAWINGS

Other objects and advantages of the invention will become apparent from a study of the specification and drawings in which.

DETAILED DESCRIPTION OF THE INVENTION

Figure 1:
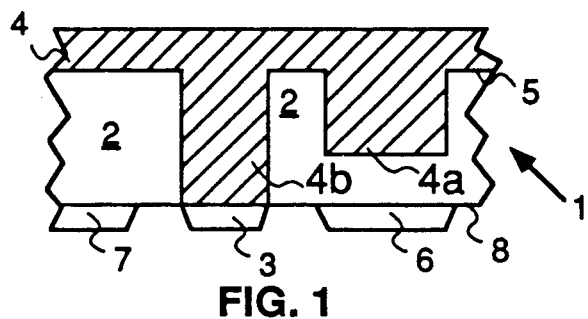
FIG. 1 illustrates in cross section a device in accordance with the present invention; and in FIG. 2a–2j the steps are illustrated for producing the device of the present invention.

The integrated circuit device of the present invention is illustrated in FIG. 1 in cross section and denoted by reference character 1. Device 1 is a cross sectional view of one portion of a semiconductor wafer which would include numerous similar devices, however, for detail a highly exploded view in cross section is illustrated. Device 1 includes body 2 which may be composed of for example, GaAs. Device 1 is typically applicable to a monolithic microwave integrated circuit which includes active devices such as field effect transistors as well as microstrip transmission lines for connecting active devices on the body. Referring to FIG. 1, source pad 3 is utilized to connect the source of a field effect transistor to a backplane or ground 4 located on the backside 5 of integrated circuit device 1. Source pad 3 is connected to the source (not shown) of a field effect transistor device. The active device region of device 1 is located below the gate/drain metallization 6 which connects the gate and drain of device 1 (not here shown) to other devices on the die or to a microstrip transmission line. Also illustrated in FIG. 1, is microstrip transmission line 7 which is utilized to transfer high frequency microwave signals from active devices to other active devices, or to the outside world with respect to the device 1. As heretofore mentioned, it is very important that the distance between backplane metallization 4 and the microstrip transmission line 7 be maintained at a thickness adequate to prevent the necessity of having a very narrow microstrip transmission line 7, to thus avoid the heretofore mentioned manufacturing and operational problems encountered with very narrow microstrip lines. Also, it is important to utilize a lesser depth substrate in the region which generates heat, which in FIG. 1 is the region above the gate/drain metallization 6; and accordingly, to provide for good heat transfer device 1 has been constructed such that the region of body 2 immediately above gate/drain metallization 6 is of a lesser depth from the front side 8 of device 1, thus providing good heat transfer.

The other important feature heretofore mentioned is that to avoid manufacturing difficulties and high losses with narrow microstrip lines, the distance between backside metallization 4 and microstrip line 7 must be maintained at a reasonable distance, which is achieved in device 1, since it will be appreciated that the distance between microstrip transmission line 7 and the portion of backside metallization 4 is greater than the distance above active devices in the gate/drain metallization area 6. Device 1 may be produced utilizing as a beginning point a substrate having the desired thickness for providing good transmission line characteristics, and processing the substrate to provide the heat transfer features which are desirable and which are obtained by a narrow substrate in the active device region.

For example, device 1 may be utilized in the 18 GHz or higher frequency region to deliver power equal to 1 watt and in doing so it is found that the thickness of body 2 above microstrip transmission line 7 is most desirable if it is approximately 125 microns. This spacing provides adequate distance to be able to utilize microstrip transmission line 7 of a width of approximately 5 $\mu$m for a characteristic impedance as high as 150 ohms. On the other hand, to provide adequate heat transfer the thickness between front side 8 and the deeper portion, indicated at 4a, of backside metallization 4 should be approximately 30 microns. The process found most desirable, and preferred, for producing device 1 is illustrated in the steps in FIG. 2a-2j.

Figure 2A:
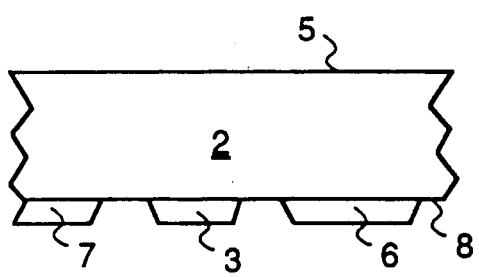
Figure 2B:
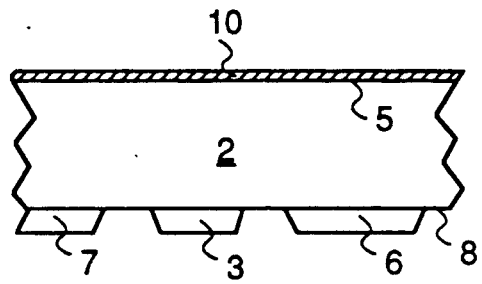

Referring to FIG. 2a, to produce device 1, starting with a completed front side having source pad 3, microstrip transmission line 7, gate/drain metallization 6 established, as well as the active device regions to which those are connected (not disclosed in this drawing), body 2 is preferably 125 microns in thickness, measured from backside 5 to front side 8. Referring to FIG. 2b, the first step is to apply a first mask 10 to backside 5. This first mask is preferably composed of $CaF_2$, is 1000 Å thick and is deposited by evaporation. Other mask materials other than $CaF_2$ may be utilized, such as Ni, with the importance of this first mask being that it not be affected by reactive ion etching (which will be used later in the process), but is removable by a wet etch which does not remove photoresist, which will be subsequently applied.

Figure 2C:
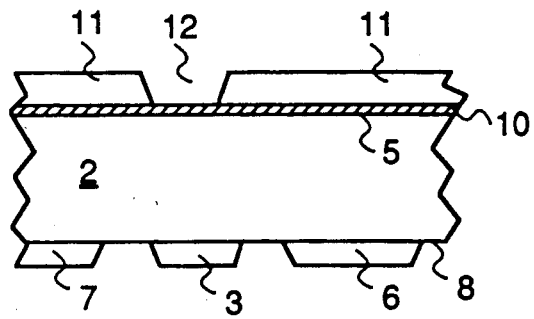

Moving to FIG. 2c, there is illustrated the application of photoresist 11 to a thickness of about 3.5 μm, which in this step has also been exposed to light to define an area in which photoresist 11 is removed down to first mask 10, this area being identified by reference character 12. Photoresist 11 may be, for example, AZ4350 which is manufactured by American Hoechst Corporation, 3070 Highway 22 West, Somerville, N.J., 08876. Following defining area 12 above source pad 3, the unprotected area of first mask 10 below area 12 is etched away with for example, by a process involving the use of a mixture of, by volume, 1 part $H_2O$ and 1 part HCl.

Figure 2D:
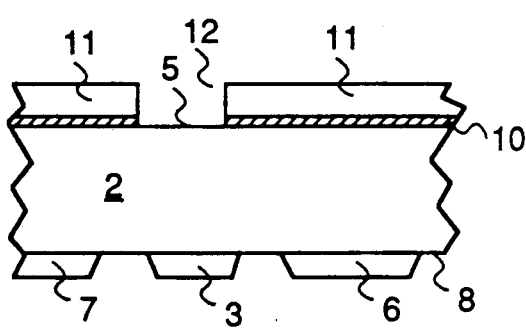
Figure 2E:
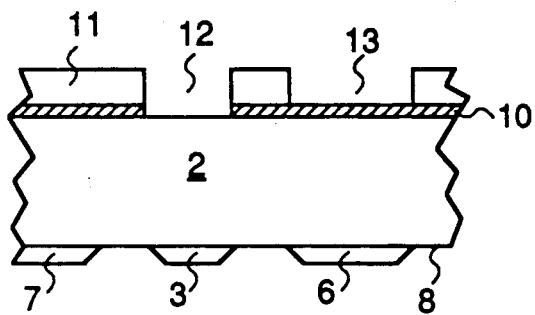
Figure 2F:
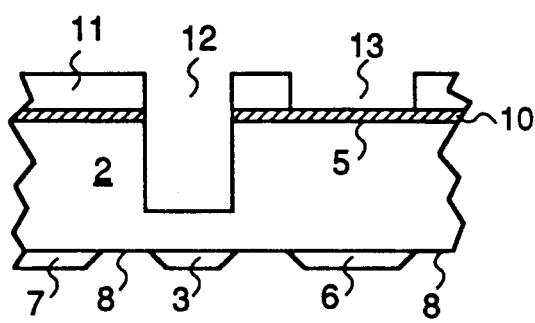

Following the removal of first mask 10 to produce the configuration illustrated in FIG. 2d, photoresist 11 is again exposed to define area 13 (as illustrated in FIG. 2e). It will be noted that area 13 is positioned such that it will define an area of body 2 which will be later removed to provide a reduced depth in body 2 for heat conduction purposes. Following removal of photoresist 11 in area 13 (as illustrated in FIG. 2e), a reactive ion etching is performed to produce the structure illustrated in FIG. 2f. The reactive ion etching process utilizes a mixture of $SiCl_4/Cl_2$, the etching being performed with a reactive ion etching process at a typical temperature of 60° C., a pressure of 100 mTorr, with the etching being performed for a time sufficient to etch body 2 to a depth or approximately 40 microns, measured from backside 5.

Figure 2G:
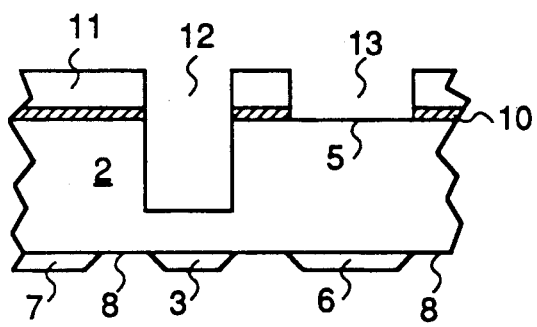
Figure 2H:
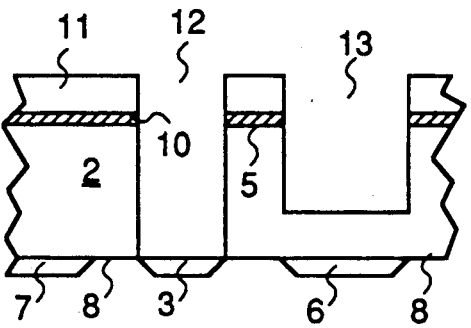

At this point, the work piece is removed from the reactive ion etching chamber and through the wet etch process of the same type utilized in the step of FIG. 2d to remove mask 10 in area 12, first mask 10 is removed in area 13 down to the backside surface 5 of body 2, producing the configuration illustrated in FIG. 2g. With body 2 being configured as illustrated in FIG. 2g, the wafer is returned to the reactive ion etching chamber and a second etch is performed (with the same process utilized in FIG. 2f above), until body 2 is removed in area 12 completely to source pad 3 and in area 13 down a distance less than that to front surface 8, producing the configuration illustrated in FIG. 2h.

Figure 2I:
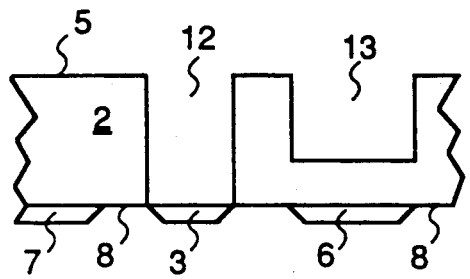
Figure 2J:
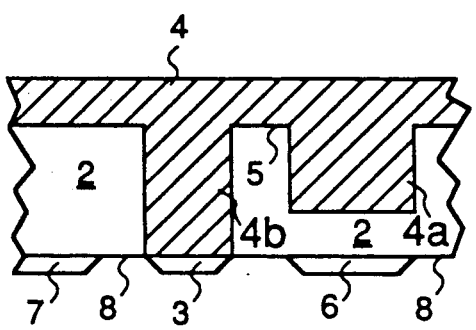

Next, photoresist 11 and first mask 10 are removed, resulting in body 5 being configured as illustrated in FIG. 2i. Then photoresist 11 is removed by first soaking in acetone and then descamming in an $O_2$ plasma. First mask 10 is removed by a wet etch process which is the same type utilized in the steps of FIG. 2d and FIG. 2g to remove mask 10.

To complete device 1, backside metallization is performed, which may be done by a plating process, to establish a via connection indicated at 4b from backside metallization 4 through body 2 to source pad 3, as well as establishing backside metallization in area 4a, which extends directly above gate/drain metallization 6 and performs the heat conduction function mentioned above.

The foregoing is merely illustrative of a particular embodiment of the invention, and to those skilled in the art to which the invention relates, many variations will become apparent without departing from the spirit and scope of the invention. It is of course also understood that the scope of the invention is not determined by the foregoing description, but only by the following claims.

I claim:

1. A process for providing a metallic backplane on a body of semiconductor material having a first side which includes integrated circuit devices and a second side, wherein said backplane provides electrical connection to a contact pad on said first side and provides heat conduction from a region on said first side, comprising the steps of:

depositing a first mask material on said second side of said body opposite to said contact pad and said region;

deposition a second mask material on said first mask material;

removing said first and second mask materials in an area opposite said contact pad;

etching said second body side to remove a portion of said body below the unprotected area;

removing said first and second mask materials in an area opposite said region;

etching said second body side for a time sufficient to remove substantially all of the body material to said contact pad but for a time less than that which removes the body material to said region;

removing said first and second mask materials; and depositing a metal on said second side of said body.

2. The process of claim 1, wherein said first mask is comprised of $CaF_2$.

3. The process of claim 2, wherein said second mask is comprised of a photoresist material.

4. The process of claim 2, wherein said etching step is performed by a reactive ion etching process.

5. The process of claim 4, wherein said reactive ion etching process utilizes $SiCl_4/Cl_2$ as the etchant.

6. The process of any one of claims 1-5, wherein said metal deposition is performed by plating.

* * * * *